United States Patent
Clark

(10) Patent No.: US 12,421,604 B2
(45) Date of Patent: Sep. 23, 2025

(54) ULTRA-SHALLOW DOPANT AND OHMIC CONTACT REGIONS BY SOLID STATE DIFFUSION

(71) Applicant: Tokyo Electron Limited, Tokyo (JP)

(72) Inventor: Robert D. Clark, Fremont, CA (US)

(73) Assignee: Tokyo Electron Limited, Tokyo (JP)

( * ) Notice: Subject to any disclaimer, the term of this patent is extended or adjusted under 35 U.S.C. 154(b) by 464 days.

(21) Appl. No.: 17/884,090

(22) Filed: Aug. 9, 2022

(65) Prior Publication Data
US 2023/0058186 A1    Feb. 23, 2023

Related U.S. Application Data

(60) Provisional application No. 63/235,595, filed on Aug. 20, 2021.

(51) Int. Cl.
*C23C 16/455* (2006.01)
*C23C 16/56* (2006.01)
(Continued)

(52) U.S. Cl.
CPC ........ *C23C 16/45553* (2013.01); *C23C 16/56* (2013.01); *H01L 21/0228* (2013.01);
(Continued)

(58) Field of Classification Search
CPC . C23C 16/45553; C23C 16/56; C23C 16/303; C23C 16/308; C23C 16/40; C23C 16/45525; H01L 21/0228; H01L 21/2254; H01L 21/324; H01L 21/2255; H01L 21/02175; H01L 21/28518; H10D 62/119; H10D 64/62; H10D 30/797; H10D 62/822;
(Continued)

(56) References Cited

U.S. PATENT DOCUMENTS 6,342,422 B1    1/2002  Wu
6,541,353 B1    4/2003  Sandhu et al.
(Continued)

FOREIGN PATENT DOCUMENTS

JP        H088252 A    *    1/1996

OTHER PUBLICATIONS

International Searching Authority, "Notification of Transmittal of The International Search Report and The Written Opinion of The International Searching Authority, or The Declaration," International Application No. PCT/US2022/039917, mailing date Nov. 28, 2022. 9 pages.
(Continued)

*Primary Examiner* — Mohammad M Hoque
(74) *Attorney, Agent, or Firm* — Slater Matsil, LLP

(57) ABSTRACT

A method of processing a substrate that includes: loading the substrate in a processing chamber, the substrate including a raised feature of a semiconductor; forming a conformal dopant layer on the raised feature by atomic layer deposition (ALD); forming a metal layer over the raised feature; thermally treating the dopant layer to form an ultra-shallow dopant region in the raised feature by diffusion of a dopant from the dopant layer into the raised feature; and thermally treating the metal layer to form an ohmic contact region in the raised feature by diffusion of a metal from the metal layer into the raised feature.

18 Claims, 12 Drawing Sheets

(51) Int. Cl.
*H01L 21/02* (2006.01)
*H01L 21/225* (2006.01)
*H01L 21/324* (2006.01)
*H10D 62/10* (2025.01)
*H10D 64/62* (2025.01)

(52) U.S. Cl.
CPC ........ *H01L 21/2254* (2013.01); *H01L 21/324* (2013.01); *H10D 62/119* (2025.01); *H10D 64/62* (2025.01)

(58) Field of Classification Search
CPC ............... H10D 64/017; H10D 30/014; H10D 30/0241; H10D 30/43; H10D 30/6735; H10D 30/6757; H10D 62/121; H10D 62/151; B82Y 10/00
USPC ........................................................ 438/778
See application file for complete search history.

(56) References Cited

U.S. PATENT DOCUMENTS

| | | | |
|---|---|---|---|
| 8,569,158 B2 | 10/2013 | Clark | |
| 8,580,664 B2 | 11/2013 | Clark | |
| 8,877,620 B2 | 11/2014 | Clark | |
| 9,012,316 B2 | 4/2015 | Clark | |
| 9,899,224 B2 | 2/2018 | Consiglio et al. | |
| 9,978,649 B2 | 5/2018 | Clark et al. | |
| 2010/0068873 A1 | 3/2010 | Lin et al. | |
| 2010/0221903 A1 | 9/2010 | Poplavskyy et al. | |
| 2012/0252196 A1* | 10/2012 | Clark | H01L 21/2255 257/E21.135 |
| 2012/0252197 A1* | 10/2012 | Clark | H01L 21/322 438/561 |
| 2012/0292733 A1 | 11/2012 | Wu et al. | |
| 2013/0001657 A1 | 1/2013 | Cheng et al. | |
| 2017/0316933 A1 | 11/2017 | Xie et al. | |
| 2018/0166532 A1* | 6/2018 | Hsu | H01L 23/535 |
| 2018/0174913 A1* | 6/2018 | More | H10D 64/62 |
| 2018/0233567 A1* | 8/2018 | Choi | H10D 84/853 |
| 2019/0181224 A1* | 6/2019 | Zhang | H10D 64/017 |
| 2021/0036146 A1* | 2/2021 | Zhou | H10D 30/43 |
| 2023/0042480 A1* | 2/2023 | Lee | H10D 30/6219 |

OTHER PUBLICATIONS

Consiglio et al., "Comparison of B2O3 and BN deposited by atomic layer deposition for forming ultrashallow dopant regions by solid state diffusion," Journal of Vacuum Science & Technology, A34(1), Jan./Feb. 2016, doi: 10.1116/1.4928705, 8 pages.

Ho et al., "Wafer-Scale, Sub-5 nm Junction Formation by Monolayer Doping and Conventional Spike Annealing," Nano Lett. Feb. 2009; doi: 10.1021/nl8032526. 21 pages.

Kim et al., "A novel doping technology for ultra-shallow junction fabrication: boron diffusion from boron-adsorbed layer by rapid thermal annealing," Thin Solid Films, vol. 369, Issues 1-2, (2000), Jul. 3, 2000, pp. 207-212, 6 pages total.

Tillack et al., "Atomic layer processing for doping of SiGe," Thin Solid Films, vol. 508, Issues 1-2, Jun. 5, 2006, pp. 279-283, 5 pages total.

* cited by examiner

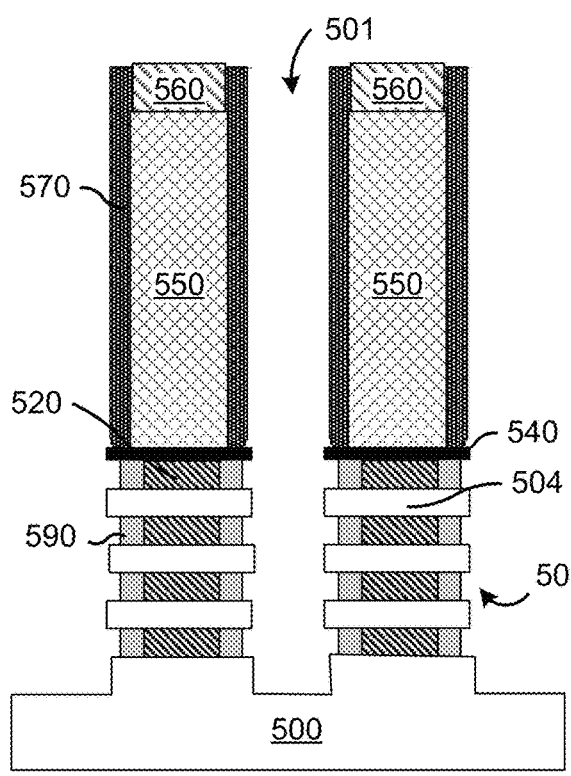
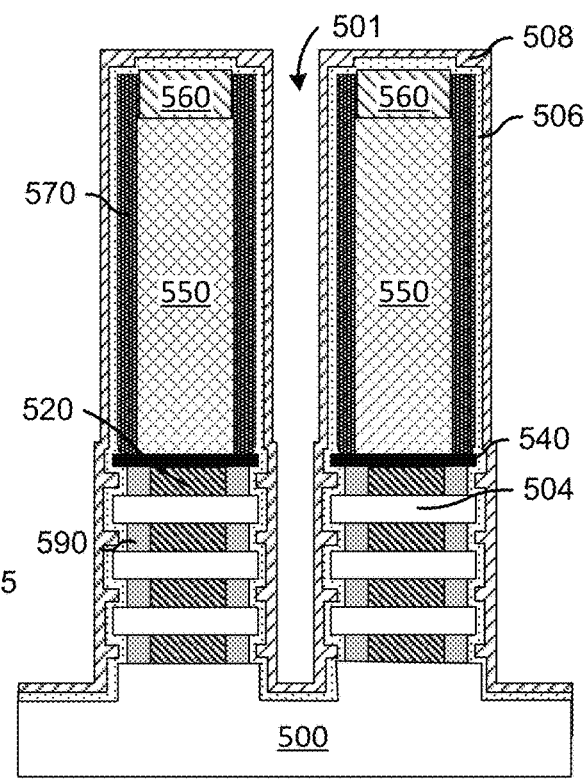
FIG. 5A
FIG. 5B
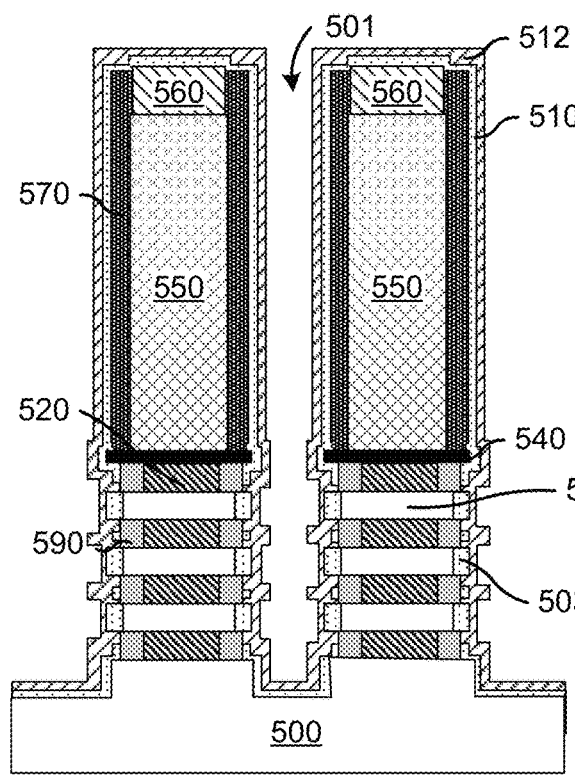
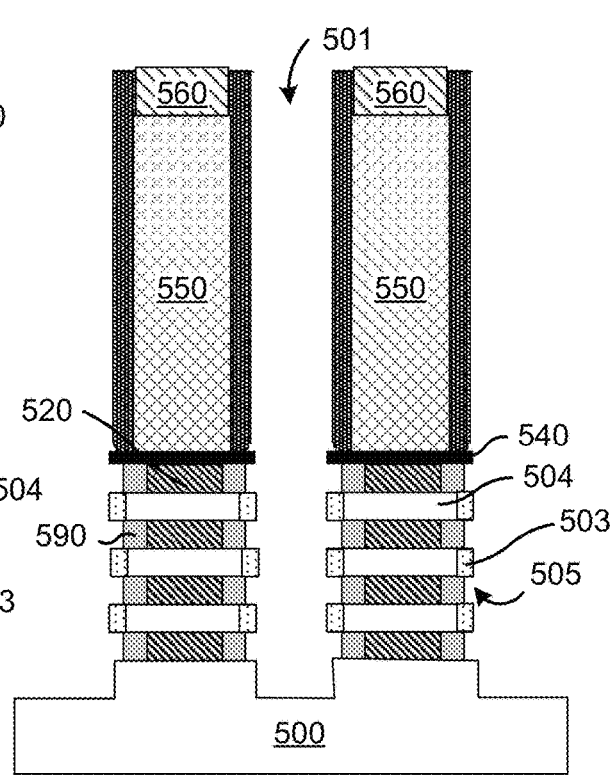
FIG. 5C
FIG. 5D

ULTRA-SHALLOW DOPANT AND OHMIC CONTACT REGIONS BY SOLID STATE DIFFUSION

CROSS-REFERENCE TO RELATED APPLICATIONS

This application claims the benefit of U.S. Provisional Application No. 63/235,595, filed on Aug. 20, 2021, which application is hereby incorporated herein by reference.

TECHNICAL FIELD

The present invention relates generally to methods of processing a substrate, and, in particular embodiments, to forming ultra-shallow dopant and ohmic contact regions by solid state diffusion.

BACKGROUND

The semiconductor industry is characterized by a trend toward fabricating larger and more complex circuits on a given semiconductor chip. The larger and more complex circuits are achieved by reducing the size of individual devices within the circuits and spacing the devices closer together. As the dimensions of the individual components within a device such as a metal oxide semiconductor (MOS) or bipolar transistor are reduced and the device components brought closer together, improved electrical performance can be obtained. However, attention must be given to the formation of doped regions in the substrate to insure that deleterious electrical field conditions do not arise.

SUMMARY

In accordance with an embodiment of the present invention, a method of processing a substrate that includes: loading the substrate in a processing chamber, the substrate including a raised feature of a semiconductor; forming a conformal dopant layer on the raised feature by atomic layer deposition (ALD); forming a metal layer over the raised feature; thermally treating the dopant layer to form an ultra-shallow dopant region in the raised feature by diffusion of a dopant from the dopant layer into the raised feature; and thermally treating the metal layer to form an ohmic contact region in the raised feature by diffusion of a metal from the metal layer into the raised feature.

In accordance with an embodiment of the present invention, a method for forming semiconductor device that includes: forming a dopant layer in direct contact with a silicon (Si) feature on a substrate; forming a metal layer on the dopant layer, the metal layer containing a metal to form a metal silicide in the Si feature; and performing a thermal treatment to form an ultra-shallow dopant region and a metal silicide region by diffusion of the dopant and the metal into the substrate, the thermal treatment including heating the substrate to an annealing temperature, where, after forming the dopant layer and prior to the thermal treatment, the substrate is maintained below the annealing temperature.

In accordance with an embodiment of the present invention, a method of processing a substrate that includes: loading the substrate in a processing chamber, the substrate including a vertical recess with a sidewall, the sidewall including a feature laterally protruding from a major surface of the sidewall, the feature having at least three faces exposed; forming a dopant layer over the feature by atomic layer deposition (ALD) at a first temperature range, the dopant layer covering at least three faces of the feature conformally; forming a metal layer over the feature at a second temperature range; thermally treating the dopant layer by keeping the substrate above the first temperature range and the second temperature range to form an ultra-shallow dopant region in the feature; and thermally treating the metal layer by keeping the substrate above the first temperature range and the second temperature range to form an ohmic contact region in the feature.

BRIEF DESCRIPTION OF THE DRAWINGS

For a more complete understanding of the present invention, and the advantages thereof, reference is now made to the following descriptions taken in conjunction with the accompanying drawings, in which:

FIGS. 1A-1F illustrate schematic cross-sectional views of a process flow for forming an ultra-shallow dopant and ohmic contact regions in a substrate according to an embodiment, wherein FIG. 1A illustrates an incoming substrate, FIG. 1B illustrates the substrate after forming a dopant layer, FIG. 1C illustrates the substrate after forming a metal layer, FIG. 1D illustrates the substrate during a thermal treatment, FIG. 1E illustrates the substrate after the thermal treatment, and FIG. 1F illustrates the substrate after removing the residue of the metal layer;

FIGS. 2A-2G illustrate schematic cross-sectional views of a process flow for forming an ultra-shallow dopant and ohmic contact regions in a substrate according to another embodiment, wherein FIG. 2A illustrates an incoming substrate, FIG. 2B illustrates the substrate after forming a dopant layer, FIG. 2C illustrates the substrate during a first thermal treatment, FIG. 2D illustrates after forming a metal layer, FIG. 2E illustrates the substrate during a second thermal treatment, FIG. 2F illustrates the substrate after the second thermal treatment, and FIG. 2G illustrates the substrate after removing the residue of the metal layer;

FIGS. 3A-3D illustrate schematic cross-sectional views of a process flow for forming an ultra-shallow dopant and ohmic contact regions in a substrate according to an alternate embodiment, wherein FIG. 3A illustrates an incoming substrate with a patterned mask layer, FIG. 3B illustrates the substrate after forming a dopant layer and a metal layer, FIG. 3C illustrates the substrate during a thermal treatment, and FIG. 3D illustrates the substrate after removing the residue of the metal layer, the dopant layer, and the patterned mask layer;

FIGS. 4A-4D illustrate schematic cross-sectional views of a process flow for forming ultra-shallow dopant regions in a raised feature on a substrate according to yet another embodiment, wherein FIG. 4A illustrates an incoming substrate having a fin feature, FIG. 4B illustrates the substrate after forming a dopant layer and a metal layer, FIG. 4C illustrates the substrate after a thermal treatment, and FIG. 4D illustrates the substrate after removing the residue of the metal layer and the dopant layer;

FIGS. 5A-5E illustrate schematic cross-sectional views of a process flow for forming ultra-shallow dopant regions in a raised feature on a substrate according to yet alternate embodiment, wherein FIG. 5A illustrates an incoming substrate having a nanowire feature, FIG. 5B illustrates the substrate after forming a dopant layer and a metal layer, FIG. 5C illustrates the substrate after a thermal treatment, FIG. 5D illustrates the substrate after removing the residue of the metal layer and the dopant layer, and FIG. 5E illustrates the substrate after an epitaxial growth of source/drain region; and FIGS. 6A-6C illustrate process flow charts of methods of forming ultra-shallow dopant regions in accordance with various embodiments, wherein FIG. 6A illustrates an embodiment, FIG. 6B illustrates another embodiment, and FIG. 6C illustrates an alternate embodiment.

DETAILED DESCRIPTION OF ILLUSTRATIVE EMBODIMENTS

Figure 1A:

This application relates to a method of processing a substrate, more particularly to forming ultra-shallow dopant and ohmic contact regions by solid state diffusion. As the size of device components such as the transistor gate in an MOS device and the emitter region in a bipolar device are reduced, the junction depth of doped regions formed in the semiconductor substrate must also be reduced. The formation of shallow junctions having a uniform doping profile and a high surface concentration has proven to be very difficult to achieve. A commonly used technique is to implant dopant atoms into the substrate with an ion implantation apparatus. In ion implantation, high energy dopant atoms are bombarded into the surface of the substrate at high velocities and are driven into the substrate by a subsequent annealing process. While this method has proven effective for the formation of doped regions having moderately deep junctions, the formation of ultra-shallow junctions using ion implantation is extremely difficult. Both the path of the energized dopant atoms within the substrate and the implant uniformity are difficult to control at the low energies necessary to form shallow implanted junctions. The implantation of energized dopant atoms damages the crystal lattice in the substrate which is difficult to repair. Dislocations resulting from the lattice damage can easily spike across a shallow junction giving rise to current leakage across the junction. Moreover, the implantation of p-type dopants such as boron, which diffuse rapidly in silicon, results in excessive dispersion of dopant atoms after they are introduced into the substrate. It then becomes difficult to form a highly confined concentration of p-type dopant atoms in a specified area in the substrate and especially at the surface of the substrate.

In addition, new device structures for transistors and memory devices are being implemented that utilize doped three-dimensional structures. Examples of such devices include, but are not limited to, fin field-effect transistors (FinFETs), tri-gate FETs, recessed channel transistors (RCATs), and embedded dynamic random access memory (EDRAM) trenches. In order to dope these structures uniformly it is desirable to have a doping method that is conformal. Ion implant processes are effectively line of sight and therefore require special substrate orientations to dope fin and trench structures uniformly. In addition, at high device densities, shadowing effects make uniform doping of fin structures extremely difficult or even impossible by ion implant techniques. Conventional plasma doping and atomic layer doping are technologies that have demonstrated conformal doping of 3-dimensional semiconductor structures, but each of these is limited in the range of dopant density and depth that can be accessed under ideal conditions. Further, at advanced semiconductor nodes, contact resistance is becoming more and more of a problem due to the inability to continue raising the dopant level, as well as Schottky barriers arising from Fermi level pinning.

Embodiments of the present application provide methods for forming ultra-shallow dopant and ohmic contact regions that overcome several of these difficulties. Ohmic contact regions may include low resistance junctions (non-rectifying) where electrical current varies linearly with the applied voltage.

Methods for forming ultra-shallow dopant and ohmic contact regions in semiconductor devices by solid phase diffusion into a substrate layer are disclosed in various embodiments. The formation of ohmic contact regions (by reaction to form a metal/semiconductor complex, e.g., NiSi or TiSi) is thought to enhance dopant diffusion into the substrate layer due to the "snowplow effect" and activation of the dopants which tend to substitutionally dope the semiconductor substrate.

In various embodiments, the methods for ultra-shallow dopant and ohmic contact regions by solid phase diffusion may offer various advantages including low resistance junctions and applicability in 3D structures (i.e., non-planar structures) over conventional ion implant processes. Atomic layer deposition (ALD) may be used to form a conformal dopant layer, which is applicable for various 3D structures. Accordingly, the methods disclosed in this application may be utilized to replace an ion implant process or in certain embodiments, to complement the ion implant process and utilized in combination.

The ultra-shallow dopant and ohmic contact regions may, for example include source-drain extensions for planar transistors, FinFETs, or tri-gate FETs. Other applications of ultra-shallow dopant and ohmic contact regions may include, but are not limited to, channel doping in replacement gate process flows to set the threshold voltage (Vt), for FinFETs to set the Vt or at the fin/STI interface to stop electrical punch-through in bulk FinFETs, or for extremely thin silicon on insulator (ET-SOI) devices, ground plane doping for ET-SOI devices including planar or FinFETs, and doping trenches for embedded DRAM capacitors. Devices with extremely thin alternative semiconductor channels may also be doped using the disclosed method, for instance germanium on insulator devices (GeOI) or Ge FinFETs, and compound semiconductor channel devices such as GaAs, InSb, InAs, InGaAs, or InGaSb FinFETs. In addition, devices formed in amorphous Si or polycrystalline Si layers, such as EDRAM devices may utilize the disclosed method to adjust the Si doping level. Further, embodiments of the present disclosure may be applied to CMOS devices containing Gate All Around (GAA) and nanowire transistor structures.

In the following, the methods for forming ultra-shallow dopant and ohmic contact regions by solid phase diffusion with a common thermal treatment for both the dopant and metal diffusion are described referring to FIGS. 1A-1F. Next, the methods with separate thermal treatments are described referring to FIGS. 2A-2G. Further embodiments are described referring to FIG. 3A-3D (with a patterned mask layer), FIG. 4A-4D (for a fin structure), and FIG. 5A-5E (for a nanowire structure). Example process flow diagrams are illustrated in FIG. 6A-6C. All figures in this disclosure are drawn for illustration purpose only and not to scale, including the aspect ratios of features.

One skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Furthermore, it is understood that the various embodiments shown in the drawings are illustrative representations and are not necessarily drawn to scale.

FIGS. 1A-1F illustrate schematic cross-sectional views of a process flow for forming an ultra-shallow dopant and ohmic contact regions in a substrate 100 according to an embodiment.

FIG. 1A illustrates a schematic cross-sectional view of a substrate 100. In various embodiments, the substrate 100 may be a part of, or including, a semiconductor device, and may have undergone a number of steps of processing following, for example, a conventional process. The substrate 100 accordingly may comprise layers of semiconductors useful in various microelectronics. For example, the semiconductor structure may comprise the substrate 100 in which various device regions are formed. The substrate 100 may be of any size, for example a 200 mm substrate, a 300 mm substrate, or an even larger substrate. According to one embodiment, the substrate 100 may contain Si, for example crystalline Si, polycrystalline Si, or amorphous Si. In one example, the substrate 100 may be a tensile-strained Si layer. According to another embodiment, the substrate 100 may contain or consist Ge or $Si_xGe_{1-x}$ compounds, where x is the atomic fraction of Si, 1-x is the atomic fraction of Ge, and $0<x<1$. Exemplary $Si_xGe_{1-x}$ compounds include $Si_{0.1}Ge_{0.9}$, $Si_{0.2}Ge_{0.8}$, $Si_{0.3}Ge_{0.7}$, $Si_{0.4}Ge_{0.6}$, $Si_{0.5}Ge_{0.5}$, $Si_{0.6}Ge_{0.4}$, $Si_{0.7}Ge_{0.3}$, $Si_{0.8}Ge_{0.2}$, and $Si_{0.9}Ge_{0.1}$. In one example, the substrate 100 may be a compressive-strained Ge layer or a tensile-strained $Si_xGe_{1-x}$ (x>0.5) deposited on a relaxed $Si_{0.5}Ge_{0.5}$ buffer layer. According to some embodiments, the substrate 100 may include a silicon-on-insulator (SOI). Further, the substrate 100 may include compound semiconductors such as GaAs, GaN, InP, InSb, InAs, InGaAs, and InGaSb. In various embodiments, the substrate 100 is patterned or embedded in other components of the semiconductor device.

Figure 1B:
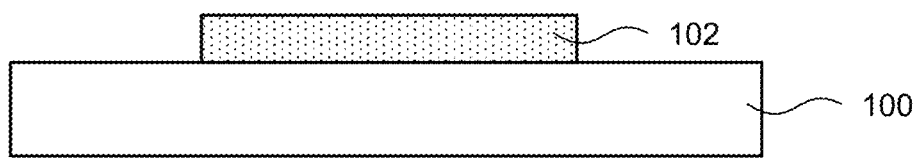

FIG. 1B illustrates a schematic cross-sectional view of the substrate 100 with a dopant layer 102 in direct physical contact with the substrate 100.

The dopant layer 102 may be deposited by atomic layer deposition (ALD) as a blanket film and thereafter patterned to form the dopant layer 102 over a portion of the substrate 100. For example, conventional photolithographic patterning and etching methods may be used to pattern the dopant layer 102. ALD is well suited for conformally depositing a dopant layer 102 over 3D structures (e.g., FIGS. 4A and 5A) with large aspect ratios.

In various embodiments, the dopant layer 102 may comprise an n-type dopant or a p-type dopant. The dopant layer 102 may include one or more dopants from Group IIIA of the Periodic Table of the Elements: boron (B), aluminum (Al), gallium (Ga), indium (In), and thallium (Tl); and Group VA: nitrogen (N), phosphorous (P), arsenic (As), antimony (Sb), and bismuth (Bi). According to some embodiments, the dopant layer 102 may contain low dopant levels, for example between about 0.5 and about 5 atomic % dopant. According to other embodiments, the dopant layer 102 may contain medium dopant levels, for example between about 5 and about 20 atomic % dopant. According to yet other embodiments, the dopant layer may contain high dopant levels, for example greater than 20 atomic percent dopant. In some examples, a thickness of the dopant layer 102 may be 4 nm or less, for example between 1 nm and 4 nm, between 2 nm and 4 nm, or between 3 nm and 4 nm. However, other thicknesses may be used in other embodiments.

The dopant layer 102 may comprise an oxide, nitride, oxynitride, or other materials that contain the one or more dopants. In an embodiment, the dopant layer 102 may comprise an oxide of the dopant, nitride of the dopant, or oxynitride of the dopant. In one example, the one or more dopants may be at least substantially uniformly distributed throughout the dopant layer 102. In other examples, the one or more dopants may be non-uniformly distributed throughout the dopant layer 102. In other examples, a concentration of the one or more dopants may decrease or increase across a thickness of the dopant layer 102 away from an interface of the dopant layer 102 and the substrate 100. A concentration gradient of the dopants in the dopant layer 102 may advantageously be utilized to tune the doping rate. According to some embodiments, the dopant layer 102 may contain or consist of a doped high-k dielectric material in the form of an oxide material, a nitride material, or an oxynitride material. The dopants in the high-k dielectric material may be selected from the list of dopants above. The high-k dielectric material may contain one or more metal elements selected from alkaline earth elements, rare earth elements, Group IIIA, Group IVA, and Group IVB elements of the Periodic Table of the Elements. Alkaline earth metal elements include beryllium (Be), magnesium (Mg), calcium (Ca), strontium (Sr), and barium (Ba). Exemplary oxide materials include magnesium oxide, calcium oxide, and barium oxide, and combinations thereof. Rare earth metal elements may be selected from the group of scandium (Sc), yttrium (Y), lutetium (Lu), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), and ytterbium (Yb). The Group IVB elements include titanium (Ti), hafnium (Hf), and zirconium (Zr). According to some embodiments of the invention, the high-k dielectric material may contain $HfO_2$, HfON, HfSiON, $ZrO_2$, ZrON, ZrSiON, $TiO_2$, TiON, $Al_2O_3$, $La_2O_3$, $W_2O_3$, $CeO_2$, $Y_2O_3$, or $Ta_2O_5$, or a combination of two or more thereof. However, other dielectric materials are contemplated and may be used.

Figure 1C:
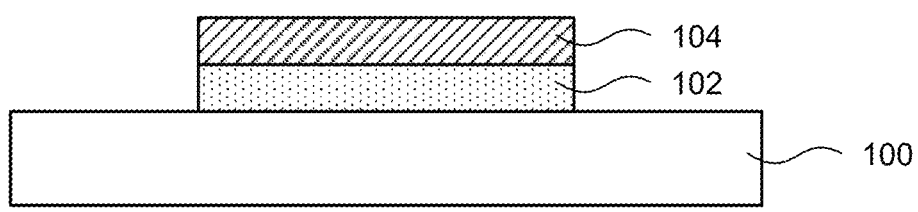

FIG. 1C illustrates a schematic cross-sectional view of the substrate 100 with a metal layer 104 formed on the dopant layer 102.

The metal layer 104 may be deposited as a blanket film and thereafter patterned to form the metal layer 104. For example, conventional photolithographic patterning and etching methods may be used to form the metal layer 104. According to another embodiment, the dopant layer 102 and the metal layer 104 may both be deposited as blanket films and, thereafter, both patterned to form the film structure schematically illustrated in FIG. 1C.

The metal layer 104 contains or consists of a metal capable of forming an ohmic contact region when reacting with the substrate 100. For example, in the case of a Si substrate, the metal is capable of forming a metal silicide contact region. In the case of germanium (Ge), the metal is capable of forming a metal germanide contact region. Further, the metal is capable of reacting with III-V semiconductors to form metal-semiconductor alloys that are ohmic conductors. In non-limiting examples, the metal may include titanium (Ti), nickel (Ni), platinum (Pt), or tungsten (W), or a combination of two or more thereof. The metal layer 104 may, for example, be deposited by physical vapor deposition (PVD), ALD, or CVD. In some examples, a thickness of the metal layer 104 may be between 1 nm and 100 nm, between 2 nm and 50 nm, or between 2 nm and 20 nm.

Figure 1D:
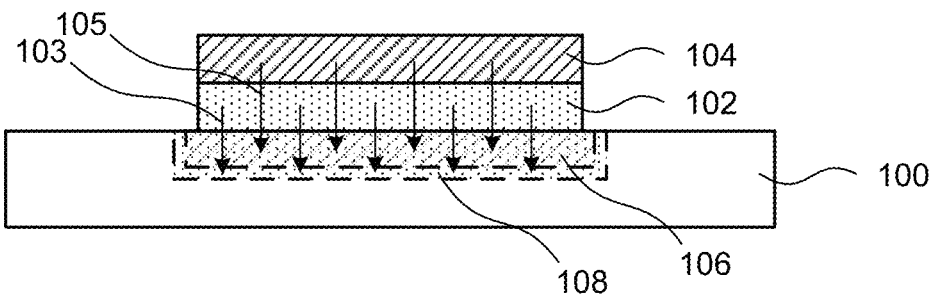

FIG. 1D illustrates a schematic cross-sectional view of the substrate 100 during a thermal treatment.

The patterned film structure in FIG. 1C may be thermally treated to diffuse both the dopant (e.g., B, Al, Ga, In, Tl, N, P, As, Sb, or Bi) and the metal (e.g., Ti, Ni, Pt, or W). During the thermal treatment, dopants diffuse into the substrate 100 and modify the chemical composition of the substrate 100, in particular, locally near the surface. The diffusion of the dopant from the dopant layer 102 into the substrate 100 is indicated by arrows 103 in FIG. 1D, and as a result of the doping, an ultra-shallow dopant region 108 may be formed in the substrate 100 underneath the dopant layer 102. The thermal treatment further activates the dopant in the dopant region 108 and also diffuses metal atoms from the metal layer 104 into the substrate 100 as indicated by arrows 105 and forms an ohmic contact region 106. The ohmic contact region 106 may be a metal silicide, for example, of Ti, Ni, Pt, or W. In various embodiments, the dopant region 108 and the ohmic contact region 106 may spatially overlap. In various embodiments, the ohmic contact formation enhances dopant diffusion into the substrate 100 and activation of the dopants in the dopant region 108.

Figure 1E:
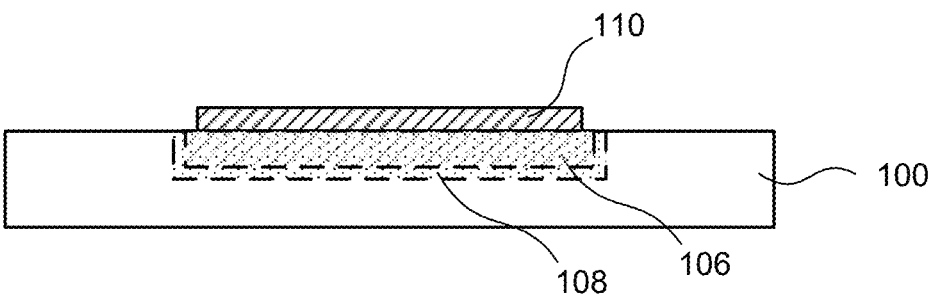
Figure 1F:
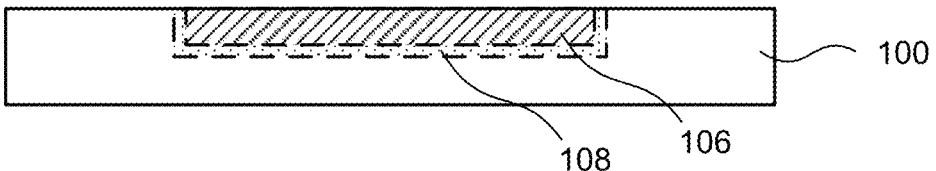

FIG. 1E illustrates a schematic cross-sectional view of the substrate 100 after the thermal treatment. FIG. 1F illustrates a schematic cross-sectional view of the substrate 100 after removing the residue of the metal layer.

In some examples, a thickness of the ultra-shallow dopant region 108 and the ohmic contact region 106 may be between 1 nm and 10 nm or between 2 nm and 5 nm. However, those skilled in the art will readily realize that the lower boundary of the regions (i.e., the ohmic contact region 106 and the ultra-shallow dopant region 108) in the substrate 100 may not be abrupt but rather characterized by gradual decrease in dopant concentration and metal concentration.

Following the thermal treatment, a residual metal layer 110 may be present on the substrate 100. This is depicted in FIG. 1E. The residual metal layer 110 may be removed from the substrate 100 using a dry etching process or a wet etching process. The resulting structure is shown in FIG. 1F. In some examples, additional thermal treatments may be used after removing the residual metal from the substrate 100. Such additional treatments may further activate the dopants. In certain embodiments, the additional thermal treatments may be performed after depositing a protective cap layer, e.g. an oxide or nitride such as silicon oxide, silicon nitride, or a combination. The protective cap layer may prevent out-gassing of the dopants during the subsequent annealing process. The subsequent annealing process may be selected to activate the dopants without causing increased out-diffusion of the metal atoms from the ohmic contact region 108.

FIGS. 2A-2G illustrate schematic cross-sectional views of a process flow for forming an ultra-shallow dopant and ohmic contact regions in a substrate 100 according to another embodiment. In this embodiment, two thermal treatments may be performed separately for a dopant layer and a metal layer. The materials (e.g., substrate, dopant layer, dopants, and metal layer compositions), processing steps, processing conditions (e.g., deposition methods and thermal treating conditions), and layer thicknesses already described above in reference to FIGS. 1A-1F may readily be used in the embodiment schematically described in FIGS. 2A-2G, and thereby some details will not be repeated.

Figure 2A:
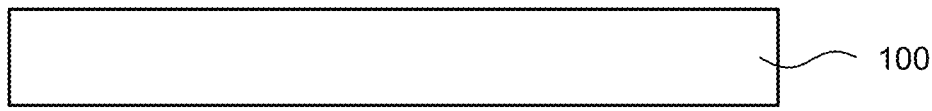
Figure 2B:
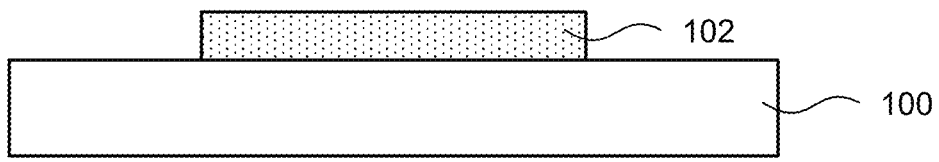
Figure 2C:
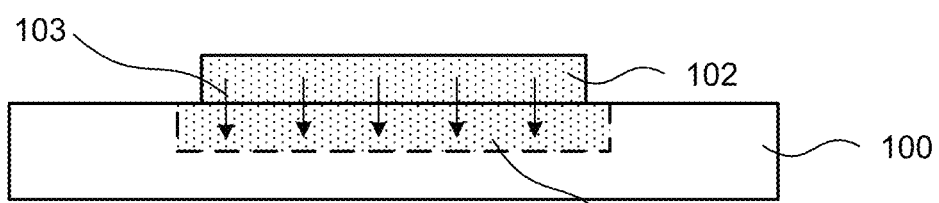

FIG. 2A illustrates a schematic cross-sectional view of the substrate 100 and FIG. 2B illustrates a schematic cross-sectional view of the substrate 100 after forming a dopant layer 102 in direct contact with the substrate 100. FIG. 2C illustrates a schematic cross-sectional view of the substrate 100 during a first thermal treatment, The dopant layer 102 in FIG. 2B may be thermally treated to diffuse a dopant from the dopant layer 102 into the substrate 100 as indicated by arrows 103 in FIG. 2C to form an ultra-shallow dopant region 108 in the substrate 100 underneath the dopant layer 102. The first thermal treatment may further activate the dopant in the dopant region 108.

Figure 2D:
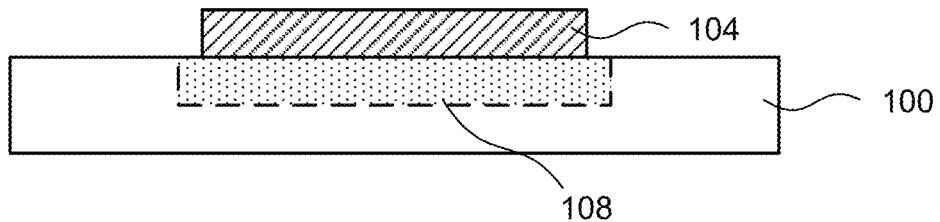
Figure 2E:
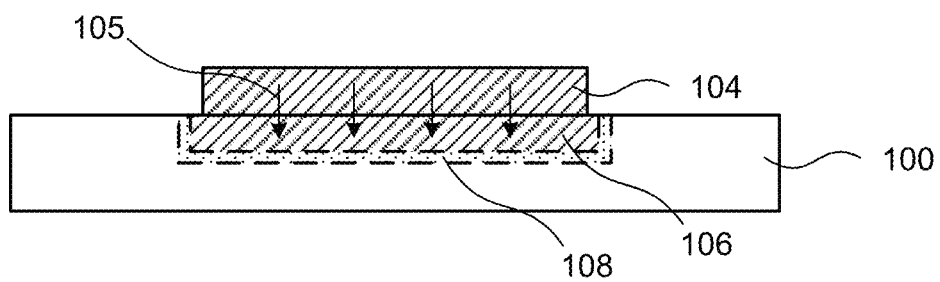
Figure 2F:
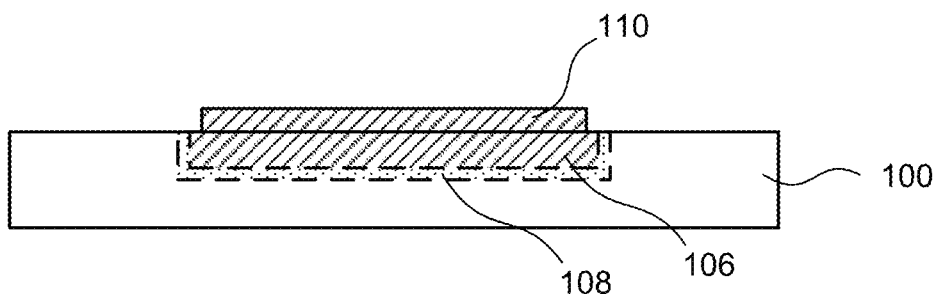
Figure 2G:
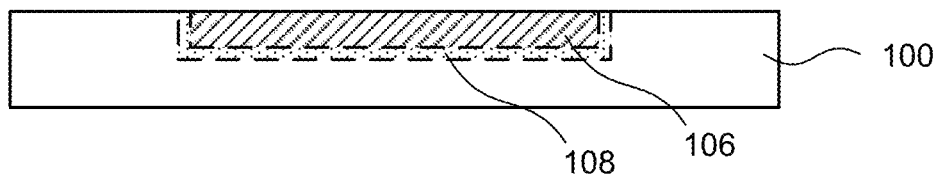

FIG. 2D illustrates a schematic cross-sectional view of the substrate 100 after forming a metal layer 104, FIG. 2E illustrates a schematic cross-sectional view of the substrate 100 during a second thermal treatment, FIG. 2F illustrates a schematic cross-sectional view of the substrate 100 after the second thermal treatment, and FIG. 2G illustrates a schematic cross-sectional view of the substrate 100 after removing the residue of the metal layer;

The metal layer 104 may be deposited as a blanket film and thereafter patterned to form the metal layer 104 in FIG. 2D. The metal layer 104 may be thermally treated to diffuse a metal from the metal layer 104 into the substrate 100 as indicated by arrows 105 in FIG. 2E and form an ohmic contact region 106. The dopant region 108 and the ohmic contact region 106 may spatially overlap but the dopant region 108 is expected to extend deeper into the substrate 100 than the ohmic contact region 106.

Following the second thermal treatment, a residual metal layer 110 may be present on the substrate 100. This is depicted in FIG. 2F. The residual metal layer 110 may be removed from the substrate 100 using a dry etching process or a wet etching process. The resulting structure is shown in FIG. 2G.

FIGS. 3A-3D illustrate schematic cross-sectional views of a process flow for forming an ultra-shallow dopant and ohmic contact regions in a substrate 300 according to an alternate embodiment. In this embodiment, the substrate 300 may have a mask layer that defines the area for the ultra-shallow dopant and ohmic contact regions. The materials (e.g., substrate, dopant layer, dopants, and cap layer compositions), processing conditions (e.g., deposition methods and thermal treating conditions), and layer thicknesses already described above in reference to FIGS. 1A-1F may readily be used in the embodiment schematically described in FIGS. 3A-3D.

Figure 3A:
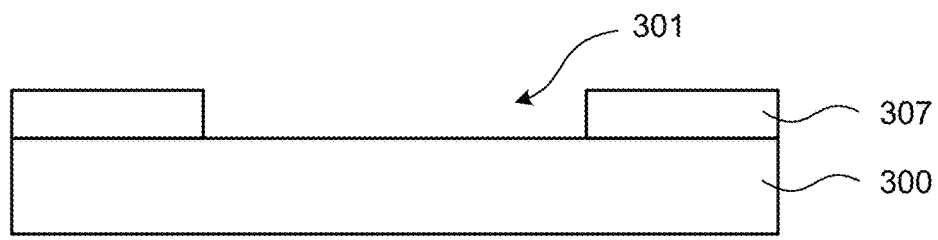

FIG. 3A illustrates a schematic cross-sectional view of the substrate 300 containing a patterned mask layer 307 formed on the substrate 300 to define a dopant window (well) 301 in the patterned mask layer 307 above the substrate 300. The patterned mask layer 307 may, for example, be a nitride hard mask (e.g., SiN hard mask) that may be formed using conventional photolithographic patterning and etching methods.

Figure 3B:
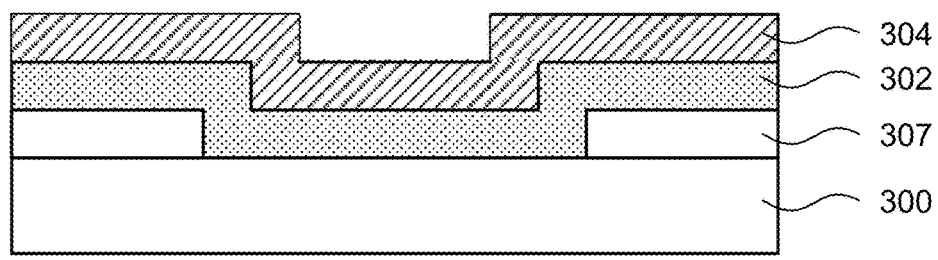

FIG. 3B illustrates a schematic cross-sectional view of the substrate 300 after forming a dopant layer 302.

The dopant layer 302 may be deposited by ALD and in direct contact with the substrate 300 in the dopant window 301 and on the patterned mask layer 307. In FIG. 3B, a metal layer 304 may also be deposited on the dopant layer 302. The dopant layer 302 may contain an n-type dopant or a p-type dopant.

Figure 3C:
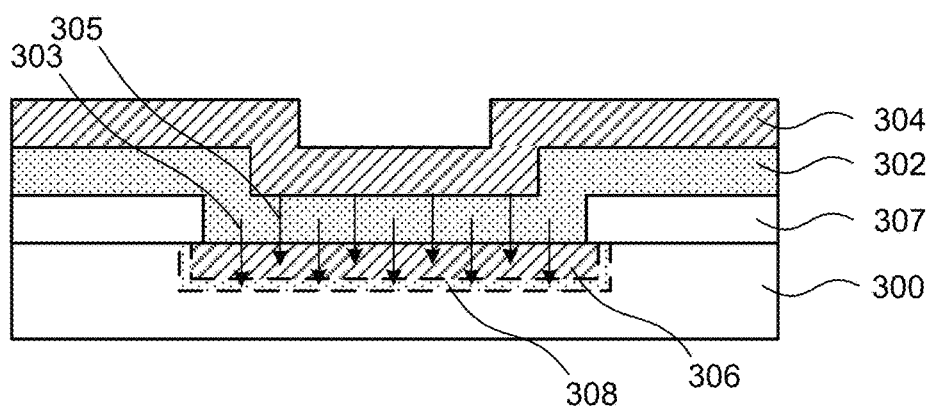

FIG. 3C illustrates a schematic cross-sectional view of the substrate 300 during a thermal treatment.

As illustrated in FIG. 3C, the film structure in FIG. 3B may be thermally treated to diffuse a dopant 303 from the dopant layer 302 into the substrate 300 and form an ultra-shallow dopant region 308 in the substrate 300 underneath the dopant layer 302 in the dopant window 301. The thermal treatment activates the dopant in the dopant region 308 and also diffuses a metal from the metal layer 304 into the substrate 300 as indicated by arrows 305 and form an ohmic contact region 306. The dopant region 308 and the ohmic contact region 306 spatially overlap but since the dopant layer 302 is closer to the substrate 100 than the metal layer 304, the dopant region 308 is expected to extend deeper into the substrate 300 than the ohmic contact region 306. The ohmic contact formation enhances dopant diffusion into the substrate 300 and activation of the dopants in the dopant region 308.

Figure 3D:
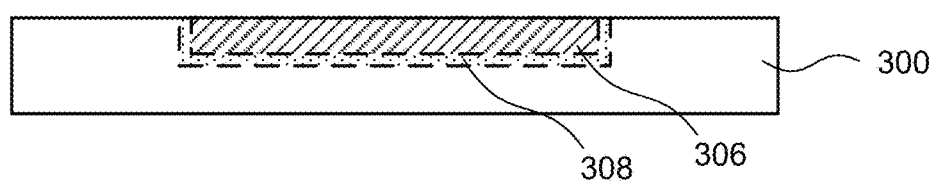

FIG. 3D illustrates a schematic cross-sectional view of the substrate 300 after removing the remaining layers.

Following the thermal treatment, a residual metal layer, a residual dopant layer, and the patterned mask layer 307 may be removed from the substrate 100 using a dry etching process or a wet etching process. The resulting structure is shown in FIG. 3D.

According to another embodiment, similar to prior embodiments with two separate thermal treatments described referring to FIG. 2A-2G, the substrate 300 may be thermally treated to form the ultra-shallow dopant region 308 prior to forming the metal layer 304 on the substrate 300, and thereafter, forming the metal layer 304 on the substrate 300, and again thermally treating the substrate 300 to form the ohmic contact region 306.

FIGS. 4A-4D illustrate schematic cross-sectional views of a process flow for forming ultra-shallow dopant regions in a raised feature on a substrate 400 according to yet another embodiment.

Figure 4A:
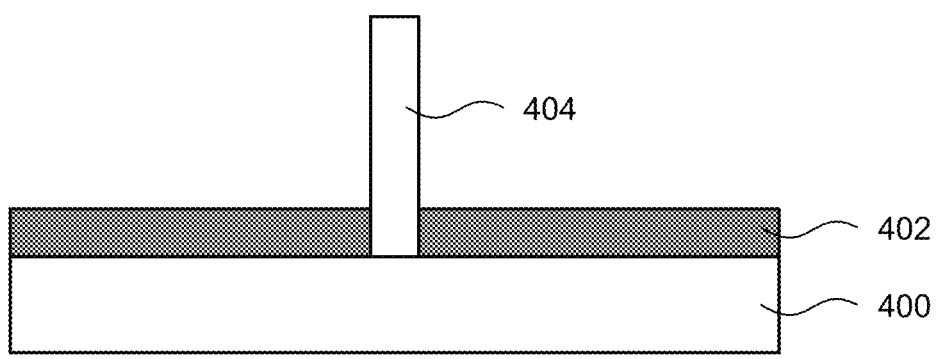

FIG. 4A illustrates a schematic cross-sectional view of a raised feature (fin) 404 and an oxide layer (e.g., $SiO_2$) 402 on a substrate 400. The material of the substrate 400 and the raised feature 404 may include one or more of the materials described above for the substrate 100 in FIG. 1A. In one example, the substrate 400 and the raised feature 404 may contain or consist of the same material (e.g., Si). Those skilled in the art will readily appreciate that embodiments of the invention may be applied to other simple or complex raised features on a substrate. According to one embodiment, the raised feature may be located at bottom of a recessed feature. The recessed feature may include a via, a trench, for example. In one embodiment, the raised feature may include a fin of a FinFET. In FIG. 4A, the raised feature 404 may have three faces (i.e., a top surface and two sidewalls in FIG. 4A) exposed and available for film formations as described below.

Figure 4B:
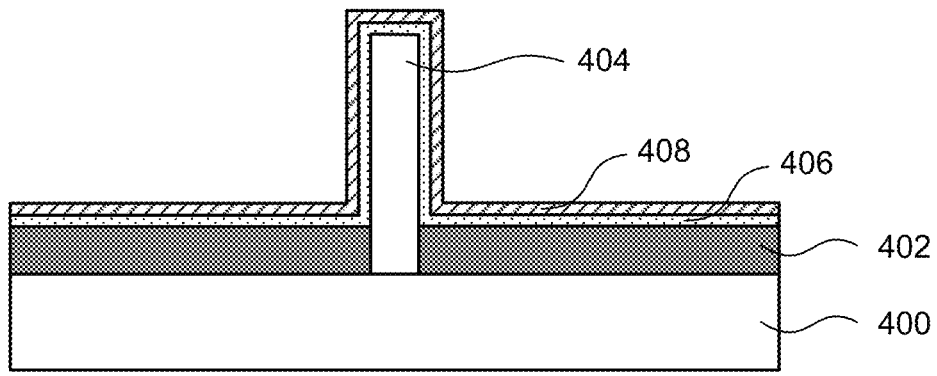

FIG. 4B illustrates a schematic cross-sectional view of the substrate 400 with a conformal dopant layer 406 and a conformal metal layer 408 deposited on the raised feature 407 and on the oxide layer 402.

The material of the conformal dopant layer 406 may include one or more of the materials described above for the dopant layer 102 in FIG. 1B. The metal of the conformal metal layer 408 may include one or more of the metals described above for the metal layer 104 in FIG. 1C. As illustrated in FIG. 4B, all the faces of the raised feature 404 exposed (including the three visible faces in FIG. 4A) may be conformally covered by the layer stack of the dopant layer 406 and the metal layer 408.

Figure 4C:
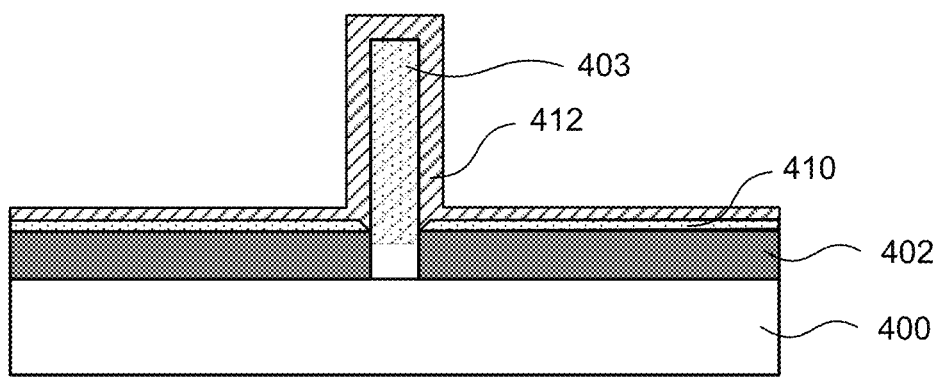

FIG. 4C illustrates a schematic cross-sectional view of the substrate 400 after a thermal treatment.

The structure in FIG. 4B may be thermally treated to diffuse a dopant from the dopant layer 406 and a metal from the metal layer 408 into the raised feature 404 to form an ultra-shallow dopant and ohmic contact region 403. The ultra-shallow dopant and ohmic contact region 403 is depicted as a single region but it may include partially overlapping ultra-shallow dopant region and an ohmic contact region as shown in FIG. 1F. The thermal treatment further activates the dopant in the ultra-shallow dopant and ohmic contact region 403. Following the thermal treatment, a residual metal layer 412 and a residual dopant layer 410 may be present.

The thermal treatment may include heating the substrate 400 in an inert atmosphere (e.g., argon (Ar) or nitrogen ($N_2$)), in an oxidizing atmosphere (e.g., oxygen ($O_2$) or water vapor ($H_2O$)), or in a reducing atmosphere (e.g., ammonia). The thermal treatment may be selected based on the composition of the metal layer 408. For example, when the metal layer 408 comprises nickel, the thermal treatment may be performed between 300° C. and 600° C. for between 10 sec and 10 min. When the metal layer 408 comprises titanium, the thermal treatment may be performed between 400° C. and 700° C. for between 10 sec and 10 min. In some cases, more than one thermal treatment may be used, for example multiple thermal treatments may be used to diffuse the dopant into the substrate, to form a first metal semiconductor complex, to form a second metal semiconductor complex, and to activate the dopant. In various embodiments, the temperature for the thermal treatment may be selected so that the diffusion of the dopant and the metal may be enabled. In one embodiment, where the metal comprises Ni, the temperature may be, for example, between 450-550° C. In another embodiment, where the metal comprises Ti, the temperature may be between 550-650° C. In some examples, the thermal treatment may include rapid thermal annealing (RTA), a spike anneal, or a laser spike anneal.

In various embodiments, in order to prevent undesired solid state diffusion prior to the thermal treatment, the formation of the dopant layer 406 and the metal layer 408 may be performed below the temperature of the thermal treatment. Accordingly, in one embodiment, the formation of the dopant layer 406 may be performed at a first temperature range, and the formation of the metal layer 408 may be performed at a second temperature range, where both the first and the second temperature ranges are below that of the thermal treatment.

Advantageously, in one or more embodiments, source/drain regions of transistors may be formed without heavy implantation processes by the use of solid state doping. The absence of implantation avoids the formation of shadow regions in complex non-planar structures. Because of the preferential segregation of dopant atoms into the silicon lattice during the silicide formation, highly active and abrupt junctions may be formed. Such junctions may not be possible to be achieved with doping techniques using traditional solid state diffusion.

Figure 4D:
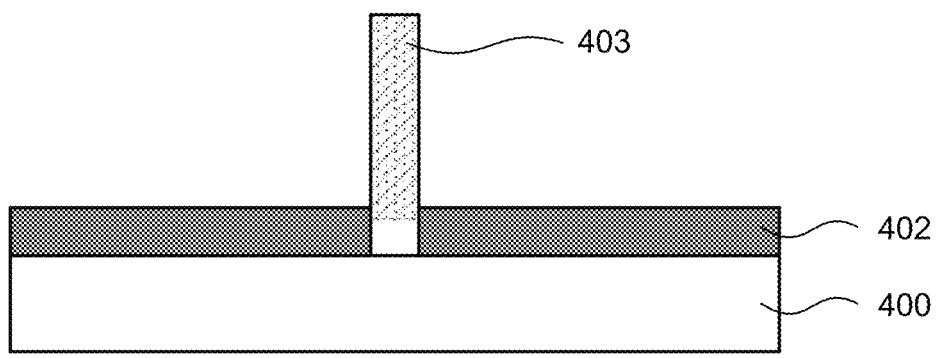

FIG. 4D illustrates a schematic cross-sectional view of the substrate 400 after removing the remaining layers.

The remaining layers after the thermal treatment (e.g., the residual metal layer 412 and the residual dopant layer 410 in FIG. 4C) may be removed from the substrate 400 using a dry etching process or a wet etching process.

FIGS. 5A-5E illustrate schematic cross-sectional views of a device during fabrication in accordance with a process flow for forming ultra-shallow dopant regions in a raised feature on a substrate 500 according to yet another embodiment. In this embodiment, the raised feature may be a part of, or include, nanowires laterally positioned for fabricating nanowire FETs.

FIG. 5A illustrates a schematic cross-sectional view of a raised feature (nanowires 504) formed in a recessed feature 501. The material of the substrate 500 and the nanowires 504 may include one or more of the materials described above for the substrate 100 in FIG. 1A. In one example, the substrate 500 and the nanowires 504 may contain or consist of the same material (e.g., Si).

As illustrated in FIG. 5A, the substrate 500 may comprise a plurality of nanowires 504. Specifically, the nanowires 504 are embedded in a different material. The nanowires 504 may be spaced apart from each other by one of a plurality of sacrificial layers or sacrificial layers 520. Thus, the substrate 500 comprises alternating layers of the sacrificial layers 520 and the nanowires 504. In various embodiments, the nanowires 504, at the end of fabrication, may form the transistor channels, while the sacrificial layers 520 will be removed in a later step of fabrication to free up a void space for the formation of gate dielectric and gate terminal. In various embodiments, the nanowires 504 have thickness of a few nanometers to tens of nanometers, for example, about 1 nm to about 20 nm in one embodiment. In another embodiment, the nanowires 504 have thickness of about 1 nm to about 10 nm in one embodiment.

In certain embodiments, the sacrificial layers 520 comprise silicon germanium (SiGe) and the nanowires 504 comprise silicon. In alternate embodiments, the sacrificial layers 520 comprise silicon and the nanowires 504 comprise silicon germanium.

As further illustrated in FIG. 5A, the sacrificial layers 520 may be made shorter in the lateral direction in the cross-sectional view than the nanowires 504, which results in lateral recesses 505 that expose the tips of the nanowires 504. Such features may be fabricated, for example, by a lateral recess etch (cavity etch) to selectively remove a portion of the sacrificial layers 520 relative to the nanowires 504.

Further, in various embodiments, inner spacers 590 may be formed to cover the surface of the sacrificial layers 520. The inner spacers 590 may comprise silicon-containing dielectric materials such as silicon nitride, silicon carbonitride (SiCN), silicon oxycarbonitride (SiOCN) and silicon boron carbonitride (SiBCN). The formation of the second sidewall spacer layer 190 may be performed by deposition from a gas phase, for example, using chemical vapor deposition (CVD), plasma-enhanced CVD (PECVD), low-pressure CVD (LPCVD) physical vapor deposition (PVD), atomic layer deposition (ALD), and/or other deposition processes. In certain embodiments, a blanket deposition of an inner spacer material may be performed followed by an etch back process to expose the tips of the nanowires 504.

As further illustrated in FIG. 5A, the substrate 500 may comprise a dielectric blocking layer 540 over the alternating layer stack of the nanowires 504 and the sacrificial layers 520. The dielectric blocking layer 140 may be an oxide layer in one embodiment. Over the dielectric blocking layer 540, the substrate 500 may further comprise a dummy gate 550. The dummy gate 550 may comprise polysilicon or amorphous silicon as example. The dummy gate 550 may have a thickness of about 50 nm to about 500 nm in various embodiments.

Still referring to FIG. 5A, a patterned hard mask 560 may be formed over the dummy gate 550, and comprise silicon oxide in one embodiment. In various embodiments, the hard mask 560 may comprise silicon nitride, silicon carbonitride (SiCN), or silicon oxycarbide (SiOC). In alternate embodiments, the hard mask 560 may comprise titanium nitride. The hard mask 560 may have a thickness of about 5 nm to about 50 nm in various embodiments.

In certain embodiments, a first sidewall spacer layer 570 may be formed to cover the dummy gate 550. The first sidewall spacer layer 570 may comprise a dielectric material comprising an oxide or a nitride. In certain embodiments, the first sidewall spacer layer 570 may comprise silicon-containing dielectric materials such as silicon oxide, silicon oxynitride (SiON), silicon oxycarbonitride (SiOCN) and silicon boron carbonitride (SiBCN). The first sidewall spacer layer 570 may have a thickness of about 1 nm to about 10 nm in various embodiments. In certain embodiments, the first sidewall spacer layer 570 may be a stacked layer comprising, for example, two or more layers using two different materials.

FIG. 5B illustrates a schematic cross-sectional view of the substrate 500 after forming a dopant layer 506 and a metal layer 508.

The dopant layer 506 may be deposited by atomic layer deposition (ALD) as a conformal blanket film. ALD is particularly suited for forming a conformal film over a 3D structure with multiple faces, which is difficult by an ion implantation technique. As illustrated in FIG. 5B, for example, all the faces of the nanowires 504 exposed in FIG. 5A may be conformally covered by the conformal dopant layer 506.

In various embodiments, the conformal dopant layer 506 may comprise an n-type dopant or a p-type dopant. N-type dopants for silicon may be arsenic, phosphorus, and antimony while p-type dopants for silicon may be boron. The conformal dopant layer 506 may comprise an oxide, nitride, oxynitride, or other materials that contain the one or more dopants. The conformal dopant layer 506 may further contain one or more metal elements selected from alkaline earth elements, rare earth elements, Group IIIA, Group IVA, and Group IVB elements of the Periodic Table of the Elements.

The metal of the conformal metal layer 508 may include titanium (Ti), nickel (Ni), platinum (Pt), or tungsten (W), or a combination of two or more thereof. The conformal metal layer 508 may, for example, be deposited by physical vapor deposition (PVD), ALD, or CVD.

FIG. 5C illustrates a schematic cross-sectional view of the substrate 500 after a thermal treatment.

The structure in FIG. 5B may be thermally treated to diffuse a dopant from the dopant layer 506 and a metal from the metal layer 508 into the nanowires 504 to form an ultra-shallow dopant and ohmic contact region 503. The ultra-shallow dopant and ohmic contact region 503 is depicted as a single region but it may include partially overlapping an ultra-shallow dopant region and an ohmic contact region as shown in FIG. 1F. The thermal treatment may include heating the substrate 500 in an inert atmosphere (e.g., argon (Ar) or nitrogen ($N_2$)), in an oxidizing atmosphere (e.g., oxygen ($O_2$) or water vapor ($H_2O$)), or in a reducing atmosphere (e.g., ammonia) to a temperature between 450° C. and 650° C. for between 10 sec and 10 min. Similar to prior embodiments described in FIG. 4A-4D, the temperature for the thermal treatment may be selected so that the diffusion of the dopant and the metal may be enabled. The thermal treatment further activates the dopant in the ultra-shallow dopant and ohmic contact region 503. Following the thermal treatment, a residual metal layer 512 and a residual dopant layer 510 may be formed.

FIG. 5D illustrates a schematic cross-sectional view of the substrate 500 after removing the remaining layers.

The remaining layers after the thermal treatment (e.g., the residual metal layer 512 and the residual dopant layer 510 in FIG. 5C) may be removed from the substrate 500 using a dry etching process or a wet etching process.

Figure 5E:
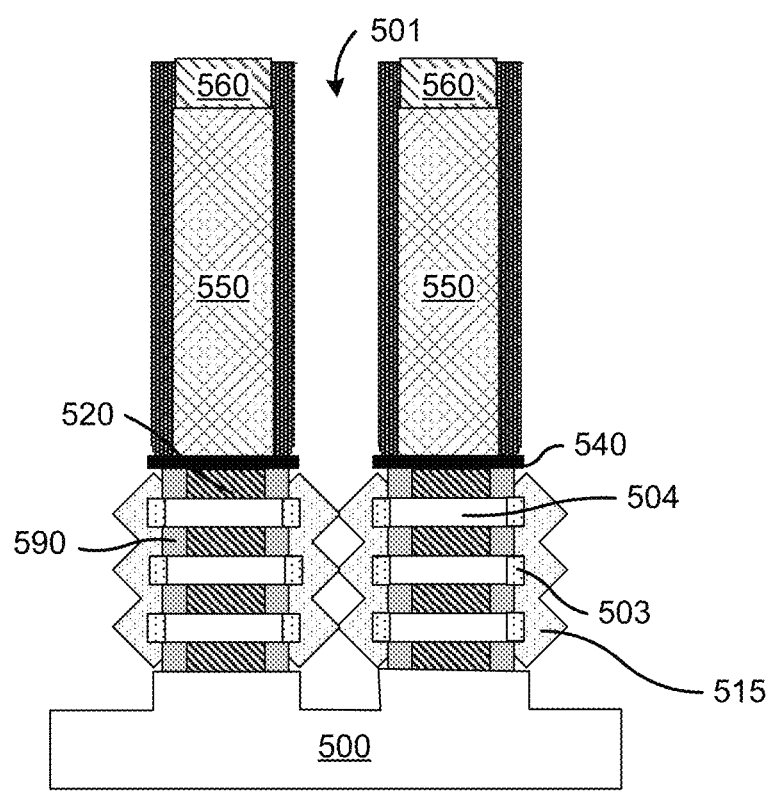
Figure 6A:
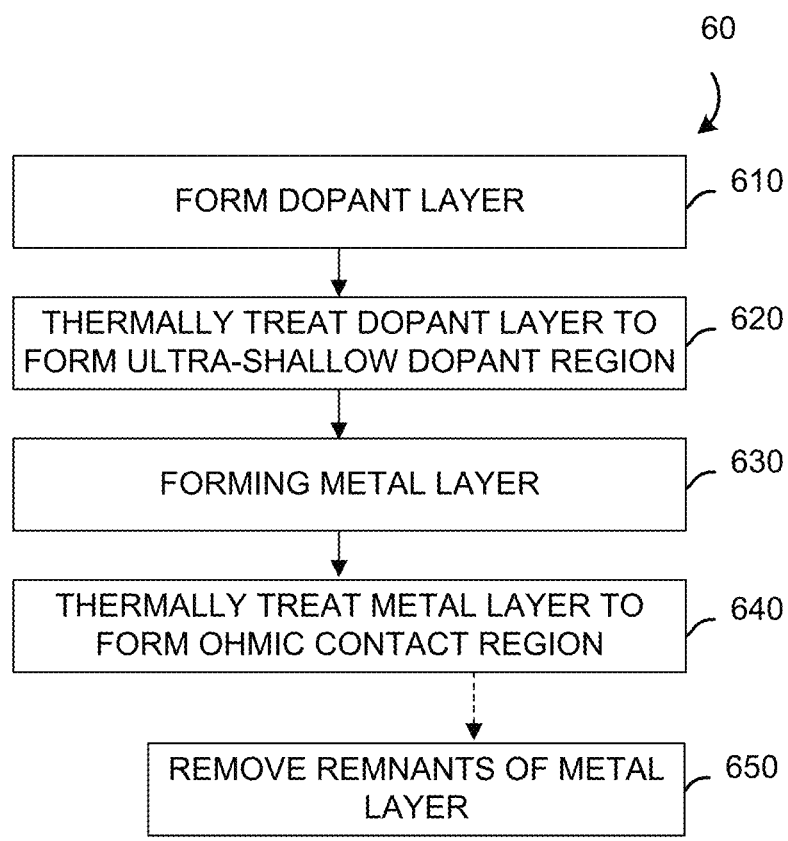
Figure 6B:
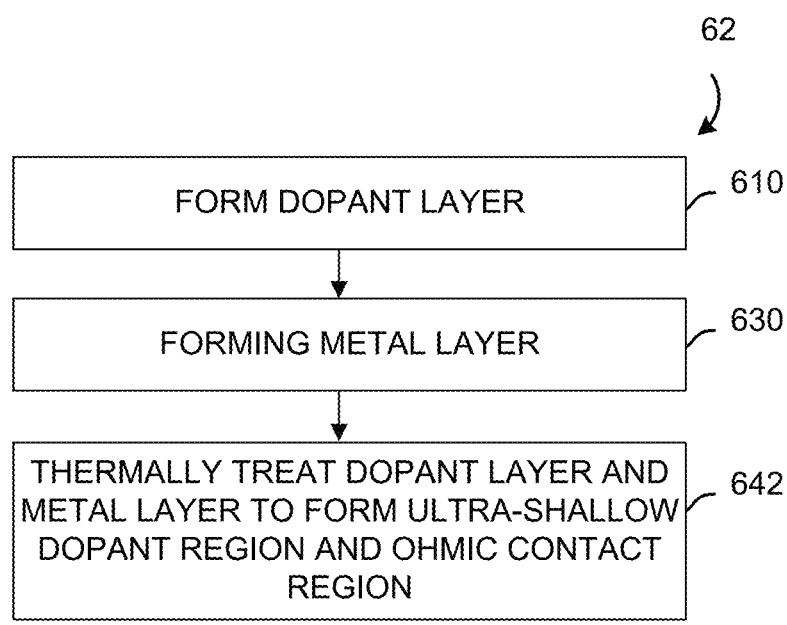
Figure 6C:
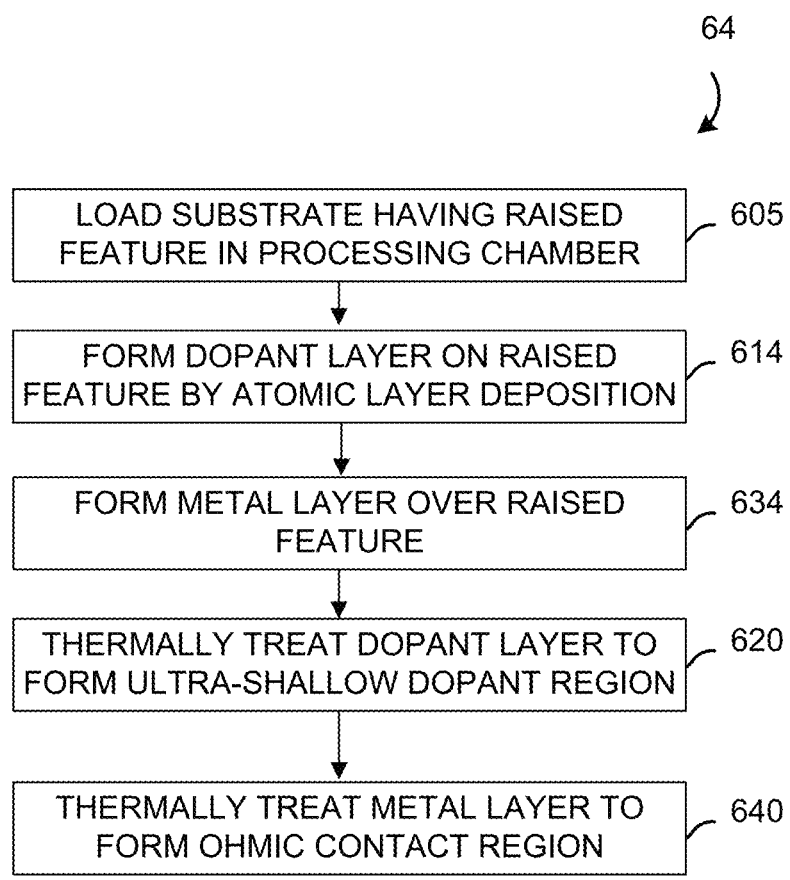

FIG. 5E illustrates a schematic cross-sectional view of the substrate 500 after an epitaxial growth of source/drain region.

After forming the ultra-shallow dopant and ohmic contact region 503 and removing the remaining layers, subsequent fabrication process may follow. In one or more embodiments, as illustrated in FIG. 5E, a source/drain region 515 may be formed around the ultra-shallow dopant and ohmic contact region 503. The source/drain region 515 fills the lateral recess 505 (illustrated in FIG. 5D) and the exposed tips of the nanowires 504. The formation of the source/drain region 515 may be performed, for example, by epitaxial growth. Although not shown, a source/drain region 515 formed with an epitaxial growth process typically has a faceted outer surface. In various embodiments, the source/drain material comprises silicon-germanium that may be doped with a p-type doping during the deposition process. In some embodiments, the source/drain material comprises silicon or silicon-carbon that may be doped with a n-type doping during the deposition process.

FIGS. 6A-6C illustrate process flow charts of methods of forming ultra-shallow dopant regions in accordance with various embodiments, wherein FIG. 6A illustrates an embodiment, FIG. 6B illustrates another embodiment, and FIG. 6C illustrates an alternate embodiment. The process flow can be followed with the figures (e.g., FIGS. 1B-1F, 2B-2G, and 4A-4D) discussed above and hence will not be described again.

In FIG. 6A, a process flow 60 starts with forming a dopant layer over a substrate (block 610, e.g., FIG. 2B). Next, the dopant layer may be thermally treated to form an ultra-shallow dopant region in the substrate by diffusion of a dopant from the dopant layer into the substrate (block 620, e.g., FIG. 2C) to expose a portion of a conductive layer comprising a first conductive material of the substrate. A metal layer may then be formed over the substrate (block 630, e.g., FIG. 2D). The metal layer may next be thermally treated to form an ohmic contact region in the substrate by diffusion of a metal from the metal layer into the substrate (block 640, e.g., FIGS. 2E-2F). In certain embodiments, the remnants of the metal layer may be removed (block 650, e.g., FIG. 2G). In alternate embodiments, the metal layer may be formed prior to thermally treating the dopant layer as illustrated in FIG. 6B.

In FIG. 6B, a process flow 62 starts with forming a dopant layer over a substrate (block 610, e.g., FIG. 1B). Next, a metal layer may then be formed over the dopant layer (block 630, e.g., FIG. 1C). Subsequently, both the dopant layer and the metal layer may be thermally treated to form an ultra-shallow dopant region and an ohmic contact region in the substrate (block 642, e.g., FIGS. 1D-1E).

In FIG. 6C, a process flow 64 starts with loading a substrate in a processing chamber, where the substrate comprises a raised feature of a semiconductor such as a fin or nanowire structure (block 605, e.g., FIG. 4A). Next, a dopant layer may be formed on the raised feature by atomic layer deposition (ALD) (block 614, e.g., FIG. 4B), followed by forming a metal layer over the raised feature (block 634, e.g., FIG. 4B). Subsequently, the dopant layer may be thermally treated to form an ultra-shallow dopant region in the raised feature (block 620, e.g., FIG. 4C). The metal layer may then be thermally treated to form an ohmic contact region in the raised feature (block 640, e.g., FIG. 4C). In certain embodiments, the above two thermal treatments, one for the dopant layer and the other for the metal layer, may be performed as a single thermal treatment to enable concurrent diffusion of the dopant and the metal.

Exemplary methods for depositing dopant layers on a substrate will now be described according to various embodiments of the invention.

According to one embodiment, a boron dopant layer may include boron oxide, boron nitride, or boron oxynitride. According to other embodiments, the boron dopant layer may contain or consist of a boron doped high-k material in the form of an oxide layer, a nitride layer, or an oxynitride layer. In one example, a boron oxide dopant layer may be deposited by ALD by a) providing a substrate in a process chamber configured for performing an ALD process, b) exposing the substrate to a vapor phase boron amide or an organoborane precursor, c) purging/evacuating the process chamber, d) exposing the substrate to a reactant gas containing $H_2O$, $O_2$, or $O_3$, a combination thereof, e) purging/evacuating the process chamber, and f) repeating steps b)-e) any number of times until the boron oxide dopant layer has a desired thickness. According to other embodiments, a boron nitride dopant layer may be deposited using a reactant gas containing $NH_3$ in step d), or a boron oxynitride dopant layer may be deposited using in step d) a reactant gas containing 1) $H_2O$, $O_2$, or $O_3$, and $NH_3$, or 2) NO, $NO_2$, or $N_2O$, and optionally one or more of $H_2O$, $O_2$, $O_3$, and $NH_3$.

According to embodiments of the invention, the boron amide may be include a boron compound of the form $LnB(NR_1R_2)_3$ where L is a neutral Lewis base, n is 0 or 1, and each of R1 and R2 may be selected from alkyls, aryls, fluoroalkyls, fluoroaryls, alkoxyalkyls, and aminoalkyls. Examples of boron amides include $B(NMe_2)_3$, $(Me_3)B(NMe_2)_3$, and $B[N(CF_3)_2]_3$. According to embodiments of the invention, the organoborane may include a boron compound of the form $Ln\, BR_1R_2R_3$ where L is a neutral Lewis base, n is 0 or 1, and each of R1, R2 and R3 may be selected from alkyls, aryls, fluoroalkyls, fluoroaryls, alkoxyalkyls, and aminoalkyls. Examples of boron amides include $BMe_3$, $(Me_3N)BMe_3$, $B(CF_3)_3$, and $(Me_3N)B(C_6F_3)$.

According to one embodiment, an arsenic dopant layer may include arsenic oxide, arsenic nitride, or arsenic oxynitride. According to other embodiments, the arsenic dopant layer may contain or consist of an arsenic doped high-k material in the form of an oxide layer, a nitride layer, or an oxynitride layer. In one example, an arsenic oxide dopant layer may be deposited by ALD by a) providing a substrate in a process chamber configured for performing an ALD process, b) exposing the substrate to a vapor phase precursor containing arsenic, c) purging/evacuating the process chamber, d) exposing the substrate to $H_2O$, $O_2$, or $O_3$, a combination thereof, e) purging/evacuating the process chamber, and f) repeating steps b)-e) any number of times until the arsenic oxide dopant layer has a desired thickness. According to other embodiments, an arsenic nitride dopant layer may be deposited using NH3 in step d), or an arsenic oxynitride dopant layer may be deposited using in step d): 1) $H_2O$, $O_2$, or $O_3$, and $NH_3$, or 2) NO, $NO_2$, or $N_2O$, and optionally one or more of $H_2O$, $O_2$, $O_3$, and $NH_3$. According to some embodiments of the invention, the vapor phase precursor containing arsenic may include an arsenic halide, for example $AsCl_3$, $AsBr_3$, or $AsI_3$.

According to one embodiment, a phosphorous dopant layer may include phosphorous oxide, phosphorous nitride, or phosphorous oxynitride. According to other embodiments, the phosphorous dopant layer may contain or consist of a phosphorous doped high-k material in the form of an oxide layer, a nitride layer, or an oxynitride layer. In one example, a phosphorous oxide dopant layer may be deposited by ALD by a) providing a substrate in a process chamber configured for performing an ALD process, b) exposing the substrate to a vapor phase precursor containing phosphorous, c) purging/evacuating the process chamber, d) exposing the substrate to a reactant gas containing $H_2O$, $O_2$, or $O_3$, a combination thereof, e) purging/evacuating the process chamber, and f) repeating steps b)-e) any number of times until the boron oxide dopant layer has a desired thickness. According to other embodiments, a phosphorous nitride dopant layer may be deposited using a reactant gas containing $NH_3$ in step d), or a phosphorous oxynitride dopant layer may be deposited using a reactant gas containing in step d): 1) $H_2O$, $O_2$, or $O_3$, and $NH_3$, or 2) NO, $NO_2$, or $N_2O$, and optionally one or more of $H_2O$, $O_2$, $O_3$, and $NH_3$. According to some embodiments of the invention, the vapor phase precursor containing phosphorus may include $[(CH_3)_2N]_3PO$, $P(CH_3)_3$, $PH_3$, $OP(C_6H_5)_3$, $OPCl_3$, $PCl_3$, $PBr_3$, $[(CH_3)_2N]_3P$, $P(C_4H_9)_3$.

Example embodiments of the invention are summarized here. Other embodiments can also be understood from the entirety of the specification as well as the claims filed herein.

Example 1. A method of processing a substrate that includes: loading the substrate in a processing chamber, the substrate including a raised feature of a semiconductor; forming a conformal dopant layer on the raised feature by atomic layer deposition (ALD); forming a metal layer over the raised feature; thermally treating the dopant layer to form an ultra-shallow dopant region in the raised feature by diffusion of a dopant from the dopant layer into the raised feature; and thermally treating the metal layer to form an ohmic contact region in the raised feature by diffusion of a metal from the metal layer into the raised feature.

Example 2. The method of example 1, where thermally treating the dopant layer is performed prior to thermally treating the metal layer.

Example 3. The method of one of examples 1 or 2, where the dopant layer includes an oxide of the dopant, a nitride of the dopant, or an oxynitride of the dopant and the ohmic contact region includes a metal silicide.

Example 4. The method of one of examples 1 to 3, where the dopant is selected from a group consisting of boron (B), aluminum (Al), gallium (Ga), indium (In), and thallium (Tl), nitrogen (N), phosphorous (P), arsenic (As), antimony (Sb), and bismuth (Bi), where the metal includes titanium (Ti), nickel (Ni), platinum (Pt), or tungsten (W).

Example 5. The method of one of examples 1 to 4, further including, after thermally treating the metal layer, removing remnants of the metal layer from the substrate.

Example 6. The method of one of examples 1 to 5, where the ultra-shallow dopant region and ohmic contact region partially overlap in the substrate, and where the ultra-shallow dopant region extends further into the substrate than the ohmic contact region.

Example 7. A method for forming semiconductor device that includes: forming a dopant layer in direct contact with a silicon (Si) feature on a substrate; forming a metal layer on the dopant layer, the metal layer containing a metal to form a metal silicide in the Si feature; and performing a thermal treatment to form an ultra-shallow dopant region and a metal silicide region by diffusion of the dopant and the metal into the substrate, the thermal treatment including heating the substrate to an annealing temperature, where, after forming the dopant layer and prior to the thermal treatment, the substrate is maintained below the annealing temperature.

Example 8. The method of example 7, where forming the dopant layer includes conformally depositing the dopant layer over the substrate by atomic layer deposition (ALD).

Example 9. The method of one of examples 7 or 8, where forming the dopant layer includes depositing an oxide, nitride, oxynitride of the dopant.

Example 10. The method of one of examples 7 to 9, where forming the dopant layer includes exposing the substrate to a vapor phase boron amide or an organoborane precursor.

Example 11. The method of one of examples 7 to 10, where forming the dopant layer includes exposing the substrate to a vapor phase precursor containing arsenic or phosphorus.

Example 12. The method of one of examples 7 to 11, where the Si feature includes a raised feature.

Example 13. The method of one of examples 7 to 12, where the dopant layer covers more than one face of the substrate.

Example 14. The method of one of examples 7 to 13, where the dopant is selected from a group consisting of boron (B), aluminum (Al), gallium (Ga), indium (In), and thallium (Tl), nitrogen (N), phosphorous (P), arsenic (As), antimony (Sb), and bismuth (Bi), and where the metal includes titanium (Ti), nickel (Ni), platinum (Pt), or tungsten (W).

Example 15. The method of one of examples 7 to 14, where the annealing temperature is between 450° C. and 650° C.

Example 16. A method of processing a substrate that includes: loading the substrate in a processing chamber, the substrate including a vertical recess with a sidewall, the sidewall including a feature laterally protruding from a major surface of the sidewall, the feature having at least three faces exposed; forming a dopant layer over the feature by atomic layer deposition (ALD) at a first temperature range, the dopant layer covering at least three faces of the feature conformally; forming a metal layer over the feature at a second temperature range; thermally treating the dopant layer by keeping the substrate above the first temperature range and the second temperature range to form an ultra-shallow dopant region in the feature; and thermally treating the metal layer by keeping the substrate above the first temperature range and the second temperature range to form an ohmic contact region in the feature.

Example 17. The method of example 16, where the metal layer is in direct contact with the dopant layer.

Example 18. The method of one of examples 16 or 17, where thermally treating the dopant layer is performed prior to forming the metal layer, the metal layer being in direct contact with the feature.

Example 19. The method of one of examples 16 to 18, where thermally treating the dopant layer or thermally treating the metal layer is performed under an inert atmosphere or in an oxidizing atmosphere.

Example 20. The method of one of examples 16 to 19, where the feature includes silicon (Si) and the ohmic contact region includes metal silicide.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of processing a substrate, the method comprising:
   loading the substrate in a processing chamber, the substrate comprising a raised feature of a semiconductor;
   forming a conformal dopant layer on the raised feature by atomic layer deposition (ALD);
   forming a metal layer over the raised feature;

thermally treating the conformal dopant layer to form an ultra-shallow dopant region in the raised feature by diffusion of a dopant from the conformal dopant layer into the raised feature; and thermally treating the metal layer to form an ohmic contact region in the raised feature by diffusion of a metal from the metal layer into the raised feature, wherein the conformal dopant layer comprises an oxide containing the dopant, a nitride containing the dopant, or an oxynitride containing the dopant and the ohmic contact region comprises a metal silicide.

2. The method of claim 1, wherein thermally treating the conformal dopant layer is performed prior to thermally treating the metal layer.

3. The method of claim 1, wherein the dopant is selected from a group consisting of boron (B), aluminum (Al), gallium (Ga), indium (In), and thallium (Tl), nitrogen (N), phosphorous (P), arsenic (As), antimony (Sb), and bismuth (Bi), wherein the metal comprises titanium (Ti), nickel (Ni), platinum (Pt), or tungsten (W).

4. The method of claim 1, further comprising, after thermally treating the metal layer, removing remnants of the metal layer from the substrate.

5. The method of claim 1, wherein the ultra-shallow dopant region and the ohmic contact region partially overlap in the substrate, and wherein the ultra-shallow dopant region extends further into the substrate than the ohmic contact region.

6. A method for forming semiconductor device, the method comprising:

forming a dopant layer in direct contact with a silicon (Si) feature on a substrate, wherein forming the dopant layer comprises depositing an oxide, nitride, oxynitride containing a dopant;

forming a metal layer on the dopant layer, the metal layer containing a metal to form a metal silicide in the Si feature; and performing a thermal treatment to form an ultra-shallow dopant region and a metal silicide region by diffusion of the dopant and the metal into the Si feature, the thermal treatment comprising heating the substrate to an annealing temperature, wherein, after forming the dopant layer and prior to the thermal treatment, the substrate is maintained below the annealing temperature.

7. The method of claim 6, wherein forming the dopant layer comprises conformally depositing the dopant layer over the substrate by atomic layer deposition (ALD).

8. The method of claim 6, wherein forming the dopant layer comprises exposing the substrate to a vapor phase boron amide or an organoborane precursor.

9. The method of claim 6, wherein forming the dopant layer comprises exposing the substrate to a vapor phase precursor containing arsenic or phosphorus.

10. The method of claim 6, wherein the Si feature comprises a raised feature.

11. The method of claim 6, wherein the dopant layer covers more than one face of the substrate.

12. The method of claim 6, wherein the dopant is selected from a group consisting of boron (B), aluminum (Al), gallium (Ga), indium (In), and thallium (Tl), nitrogen (N), phosphorous (P), arsenic (As), antimony (Sb), and bismuth (Bi), and wherein the metal comprises titanium (Ti), nickel (Ni), platinum (Pt), or tungsten (W).

13. The method of claim 6, wherein the annealing temperature is between 450° C. and 650° C.

14. A method of processing a substrate, the method comprising:

loading the substrate in a processing chamber, the substrate comprising a vertical recess with a sidewall, the sidewall comprising a feature laterally protruding from a major surface of the sidewall, the feature having at least three faces exposed;

forming a dopant layer over the feature by atomic layer deposition (ALD) at a first temperature range, the dopant layer covering at least three faces of the feature conformally, wherein forming the dopant layer comprises depositing an oxide including a dopant, a nitride including the dopant, or an oxynitride including the dopant;

forming a metal layer over the feature at a second temperature range;

thermally treating the dopant layer by keeping the substrate above the first temperature range and the second temperature range to form an ultra-shallow dopant region in the feature; and thermally treating the metal layer by keeping the substrate above the first temperature range and the second temperature range to form an ohmic contact region in the feature.

15. The method of claim 14, wherein the metal layer is in direct contact with the dopant layer.

16. The method of claim 14, wherein thermally treating the dopant layer is performed prior to forming the metal layer, the metal layer being in direct contact with the feature.

17. The method of claim 14, wherein thermally treating the dopant layer or thermally treating the metal layer is performed under an inert atmosphere or in an oxidizing atmosphere.

18. The method of claim 14, wherein the feature comprises silicon (Si) and the ohmic contact region comprises metal silicide.

* * * * *